United States Patent [19]

Sakamoto et al.

[11] Patent Number: 4,746,557
[45] Date of Patent: May 24, 1988

[54] LC COMPOSITE COMPONENT

[75] Inventors: Yukio Sakamoto; Takeshi Tanabe; Yasuo Fujiki; Hiromichi Sakai; Kunisaburo Tomono; Michihiro Murata; Harufumi Mandai; Yasuyuki Naito, all of Nagaokakyo; Hidemichi Mori, Fukui, all of Japan

[73] Assignee: Murata Manufacturing Co., Ltd., Japan

[21] Appl. No.: 939,346

[22] Filed: Dec. 8, 1986

[30] Foreign Application Priority Data

Dec. 9, 1985 [JP] Japan .............................. 60-190167[U]
Dec. 9, 1985 [JP] Japan .............................. 60-190168[U]

[51] Int. Cl.$^4$ ..................... B32B 3/10; H05K 1/00; H03H 7/00; H01G 4/10
[52] U.S. Cl. .................................... 428/138; 428/209; 428/901; 174/68.5; 361/321; 333/184; 29/602 R
[58] Field of Search ............... 428/138, 209, 901; 174/68.5; 361/321; 333/184; 29/602 R

[56] References Cited

U.S. PATENT DOCUMENTS

| | | | |
|---|---|---|---|
| 4,322,698 | 3/1982 | Takahashi et al. | 333/184 |
| 4,547,625 | 10/1985 | Tosaki et al. | 174/68.5 |
| 4,573,101 | 2/1986 | Takeno | 361/321 |

Primary Examiner—John E. Kittle
Assistant Examiner—Patrick J. Ryan
Attorney, Agent, or Firm—Ostrolenk, Faber, Gerb & Soffen

[57] ABSTRACT

An LC composite component employing a ceramic sintered body obtained by laminating pluralities of magnetic green sheets and dielectric green sheets and cofiring the same. The ceramic sintered body is provided therein with a magnetic region and a dielectric region along the direction of thickness. The magnetic region of the sintered body is provided with at least one inner electrode layer which extends to first opposite side surfaces of the sintered body, thereby to define an inductance unit. The dielectric region is provided with a plurality of electrodes oppositely arranged through the dielectric substance, which plurality of electrodes includes first and second electrodes. A pair of first outer electrodes are formed on the first side surfaces of the sintered body, to be electrically connected with the inner electrode formed in the magnetic region. The first electrode in the dielectric region is electrically connected with at least one of the first outer electrodes, and the second electrodes is connected with a second outer electrode which is formed on another surface of the sintered body.

14 Claims, 7 Drawing Sheets

LC COMPOSITE COMPONENT

BACKGROUND OF THE INVENTION

1. Field of the Invention

The present invention relates to a monolithic type LC composite component which comprises an inductance unit and a capacitor unit provided in a single sintered body.

2. Description of the Prior Art

U.S. Pat. No. 4,322,698 discloses an LC composite component which comprises an inductance unit and a capacitor unit provided in a single sintered body.

In the conventional LC composite component as hereinabove described, both an inductance unit and a capacitor unit are provided in a single sintered body, in overall size. However, since one of the electrodes connected to the capacitance is an inner electrode, a magnetic region provided outside that inner electrode must be have dielectric characteristics. Thus, the space available for material for the magnetic region is restricted.

In the aforementioned LC composite component, further, the capacitor unit is defined between the inner electrode and electrodes formed on top and bottom surfaces of the sintered body for connection to the capacitance, whereby the LC circuit is restricted to being an LC circuit of a distributed constant type. Further, since the magnetic region extends in the exterior of the inner electrode, the connections to the capacitance are through the magnetic substance, leading to relatively high dielectric losses. In addition, the inner electrode defining the inductance unit is in the form of a coil pattern and cannot be increased in width. Thus, the LC composite component cannot pass a large current, whereby the same is not usable in high-current applications.

SUMMARY OF THE INVENTION

Accordingly, it is an object of the present invention to provide a type of LC composite component that provides a high degree of freedom in design and small dielectric losses.

According to a broad aspect of the present invention, an LC composite component comprises a ceramic sintered body obtained by laminating at least one magnetic green sheet and at least one dielectric green sheet and cofiring the same, such that the component is provided with a magnetic region and a dielectric region along the direction of thickness. In this LC composite component, the magnetic region is provided with at least one layer having an inductive inner electrode extending toward a pair of first opposite side surfaces of the sintered body. In order to define a capacitor unit in the dielectric region, provided are electrodes including first and second capacitive electrodes opposite to each other and enclosing part of the dielectric region in the direction of thickness. On the outer surfaces of the sintered body, a pair of first outer electrodes are provided on said pair of first side surfaces of the sintered body to be electrically connected with the aforementioned inner inductive electrode. A second outer electrode is formed on another surface of the sintered body. The first electrode is electrically connected with at least one of the first outer electrodes, while the second electrode is electrically connected with (and may be the same as) the second outer electrode.

According to the present invention, an inductance unit and a capacitor unit are defined respectively in the magnetic region and the dielectric region provided in the single sintered body. Thus, an LC composite component is obtained which is reduced in overall size similarly to the conventional LC composite component as described above. Further, capacitance is extracted through the first and second electrodes, i.e., the inductance unit is provided absolutely independently of the capacitor unit, whereby magnetic material for forming the inductance unit can be selected regardless of the characteristics of the dielectric region. Similarly, the capacitance is not extracted through the inner electrode defining the inductance unit, whereby a filter thus obtained can have circuit structure other than the distributed constant type. Thus, the present invention is applicable to various filters of the lumped constant type such as an L-type filter and a $\pi$-type filter.

Further, the capacitance is extracted independently of the magnetic region, whereby dielectric loss is reduced. In addition, the inner electrode formed in the magnetic region may not be formed on a coil pattern, whereby the LC composite component can be made resistant against a high current by increasing the inner electrode in width.

These and other objects, features, aspects and advantages of the present invention will become more apparent from the following detailed description of emodiment of the present invention when taken in conjunction with the accompanying drawings.

DESCRIPTION OF THE PREFERRED EMBODIMENTS

Figure 1:
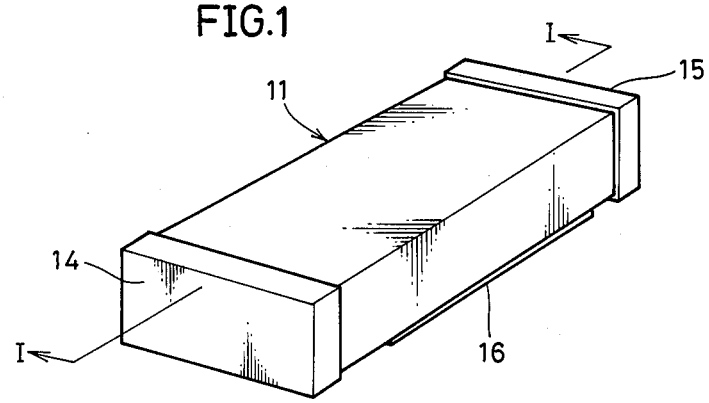
FIG. 1 is a perspective view showing a first embodiment of the present invention.
Figure 2:
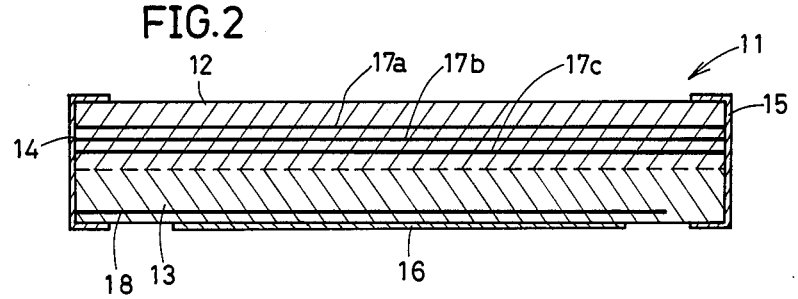
FIG. 2 is a sectional view taken along the line I—I in FIG. 1.
Figure 3:
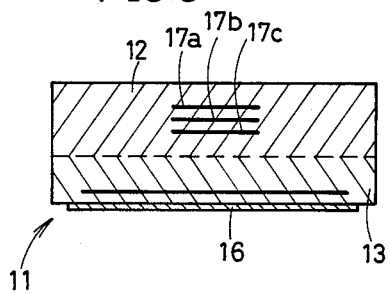
FIG. 3 is a cross-sectional view of the embodiment as shown in FIG. 1.

FIG. 1 is a perspective view showing an LC composite component according to a first embodiment of the present invention and FIG. 2 is a sectional view taken along the line I—I in FIG. 1, while FIG. 3 is a cross-sectional view of the LC composite component according to the first embodiment. A ceramic sintered body 11 has the overall form of a rectangular parallelepiped. This ceramic sintered body 11 is formed of a magnetic region 12 of magnetic material such as ferrite and a dielectric region 13 of dielectric material such as barium titanate or titanium oxide. As hereinafter described, the ceramic sintered body 11 is obtained by laminating a plurality of magnetic green sheets together with a plurality of dielectric green sheets and cofiring the same.

First outer electrodes 14 and 15 are formed on a pair of first side surfaces on opposite sides of the sintered body 11 and a second outer electrode 16 is formed on the lower surface thereof. The magnetic region 12 is provided in its interior with a plurality of inner electrodes 17a to 17c whose both ends are connected with both of the first outer electrodes 14 and 15. The inner electrodes 17a, 17b and 17c and the magnetic region 12 define an inductance unit.

On the other hand, the dielectric region 13 is provided in its interior with an electrode 18 which is opposite to the second outer electrode 16 with part of the dielectric region between them. This electrode 18 will be referred to as the "first electrode" of the present invention, and is electrically connected to the first outer electrode 14. In this embodiment, the second outer electrode 16 also serves as a "second electrode" of the present invention although in other embodiments they may be separate. Thus, capacitance of the dielectric region between the electrode 18 and the second outer electrode 16 is extracted by the electrode 18 and the second outer electrode 16. Hereinafter the term "extraction" of a capacitance, for example, will refer to connection of that capacitance to an external circuit or the like.

Figure 4:
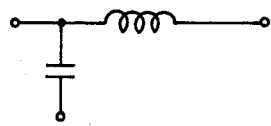
FIG. 4 illustrates an equivalent circuit of the LC composite component according to the embodiment as shown in FIG. 1.

In the LC composite component according to the embodiment of FIGS. 1 to 3, therefore, the magnetic region 12 serves as the inductance unit and the dielectric region 13 serves as a capacitor unit, thereby forming an L-shaped noise filter circuit as shown in FIG. 4.

In order to package the LC composite component on a printed board or the like, the second outer electrode 16 can be directly soldered to a ground electrode of a conductive pattern on the printed board, which will cause no undesired inductance, thereby to obtain a filter having excellent noise removing performance.

The dielectric constant of the dielectric region 13, the area of and the distance between the opposite second outer electrode 16 and the electrode 18 and the like can be appropriately selected to obtain a desired capacitance. Similarly, the magnetic permeability of the magnetic region 12, the number and the configuration of the inner electrodes 17a to 17c and the like are appropriately determined to obtain a desired inductance value.

Figure 5:
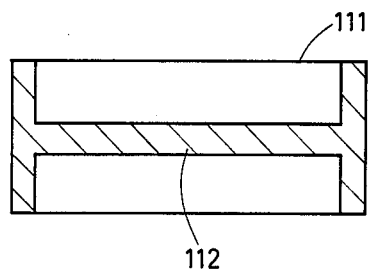
FIG. 5 is a plan view showing a magnetic green sheet employed to obtain the embodiment as shown in FIG. 1 and an electrode pattern formed on the magnetic green sheet.
Figure 6:
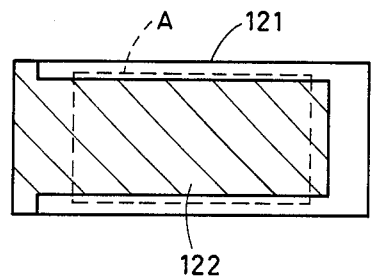
FIG. 6 is a plan view showing a dielectric green sheet employed to obtain the embodiment as shown in FIG. 1 and an electrode pattern formed on the dielectric green sheet.

The LC composite component as shown in FIG. 1 is obtained through the following steps, for example: As shown in FIG. 5, a magnetic green sheet 111 of the aforementioned magnetic material is prepared and is coated on one of its surfaces with a Pd or Ag-Pd system paste 112 for forming the inner electrode 17a, 17b or 17c. Similarly, a dielectric green sheet 121 of the aforementioned dielectric material is prepared as shown in FIG. 6, and is coated on one of its surfaces with conductive paste 122 made of Pd or Ag-Pd system paste for forming the electrode 18. The broken line A in FIG. 6 shows the outer configuration of the second outer electrode 16 which is opposite to the electrode 18. Pluralities of additional sheets like such magnetic green sheets 111 and dielectric green sheets 121 are laminated and brought into contact with each other under pressure and then cofired, thereby to obtain the ceramic sintered body 11 as shown in FIG. 1. In this embodiment, in addition to three magnetic green sheets 111 which are laminated to obtain the electrodes 17a, 17b, 17c, appropriate numbers of magnetic green sheets coated with no conductive paste are also laminated on the upper and lower ends of the sintered body 11. Thus, the inner electrodes 17a, 17b and 17c are embedded in the magnetic region 12 of the sintered body 11.

With respect to the dielectric region 13, on the other hand, a single dielectric green sheet 121 as shown in FIG. 6 is prepared and is laminated with an appropriate number of dielectric green sheets 121 coated with no conductive paste 122. Thus, the dielectric region 13 is provided therein with only a single-layer electrode 18, as shown in FIG. 2.

Then, both end surfaces referred to above as the first side surfaces of the sintered body 11 obtained in the aforementioned manner are dipped in an nonelectronic plating bath, or Ag paste or the like is coated and baked on the first side surfaces and the lower surface of the sintered body 11 for example, to form the first outer electrodes 14 and 15 and the second outer electrode 16.

Respective end portions of the inner electrodes 17a to 17c and the electrode 18, which are intended to be connected with the first outer electrodes 14 and 15 are exposed at the first side surfaces of the ceramic sintered body 11, whereby the same are connected with the first outer electrodes 14 and 15 simultaneously with formation thereof.

The material for the inner electrodes 17a to 17c and the electrode 18 is not restricted to the aforementioned noble metal materials, but may be prepared from base metals such as Ni or Pb. In this case, a manufacturing method suitable for the base metal material is employed.

Figure 7:
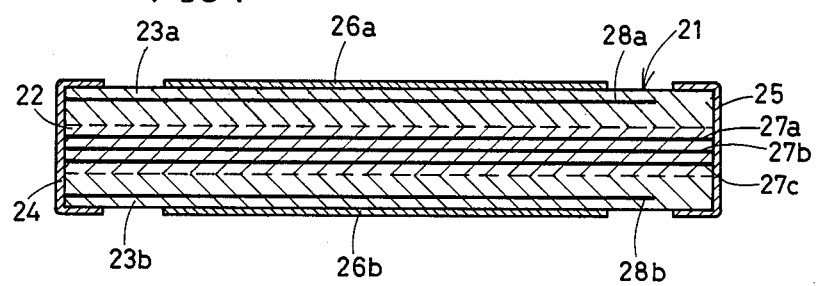
FIG. 7 is a sectional view showing a second embodiment of the present invention.
Figure 8:
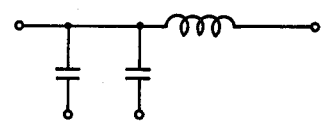
FIG. 8 illustrates an equivalent circuit of the embodiment as shown in FIG. 7.

FIG. 7 is a sectional view showing a second embodiment of the present invention. In this embodiment, a ceramic sintered body 21 has a magnetic region 22 provided on both sides along the direction of thickness with dielectric regions 23a and 23b. The dielectric regions 23a and 23b are respectively provided therein with electrodes 28a and 28b, which are electrically connected with one first outer electrode 24. Second outer electrodes 26a and 26b are formed on the top and bottom surfaces of the ceramic sintered body 21 to be opposite to the electrodes 28a and 28b partially through the dielectric regions 23a and 23b. Thus, the embodiment as shown in FIG. 7 is in such structure of providing another capacitor unit on the magnetic region 12 of the structure as shown in FIG. 2. Therefore, the other structural parts of the second embodiment are identical to those of the LC composite component of the first embodiment as shown in FIGS. 1 to 3, and hence description thereof is omitted with the same reference numerals being assigned to the corresponding parts. FIG. 8 shows an equivalent circuit of the embodiment as shown in FIG. 7.

In the embodiment as shown in FIG. 7, the second outer electrodes 26a and 26b are formed on both of the upper and lower surfaces of the sintered body 21, whereby the LC composite component can be placed on a printed board in such a direction that the second outer electrodes 26a and 26b extend upwardly, to connect the outer electrodes 24, 25, 26a and 26b with conductive patterns on the printed circuit board. As indicated by the equivalent circuit as shown in FIG. 8, this embodiment has capacitors connected in the parallel form, whereby the entire noise removing effect is higher than that of the embodiment as shown in FIG. 1. The second outer electrodes 26a and 26b may be shorted as the case may be.

Figure 9:
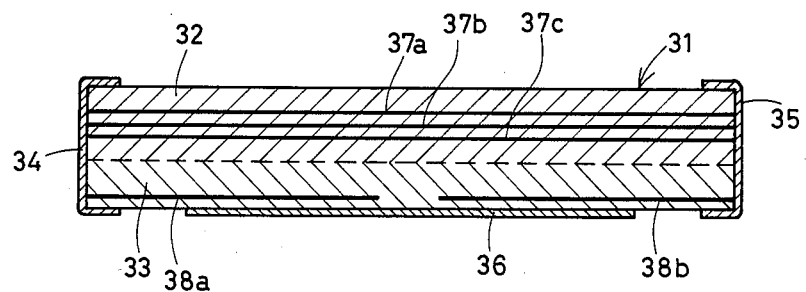
FIG. 9 is a sectional view showing an LC composite component according to a third embodiment of the present invention.
Figure 10:
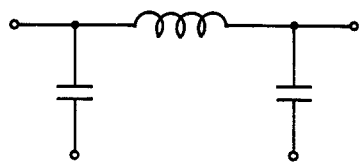
FIG. 10 illustrates an equivalent circuit of the embodiment as shown in FIG. 9.

FIG. 9 shows an LC composite component according to a third embodiment of the present invention, which is obtained by slightly modifying the LC composite component of the embodiment as shown in FIG. 1. In this embodiment, a ceramic sintered body 31 has a magnetic region 32 and a dielectric region 33, while the dielectric region 33 is provided therein with electrodes 38a and 38b which are opposite to s second outer electrode 36 respectively. The electrode 38a is electrically connected with one first outer electrode 34, and the electrode 38b is electrically connected with another first outer electrode 35. Thus, the embodiment as shown in FIG. 9 forms the so-called π-type noise filter as shown in FIG. 10.

Figure 11:
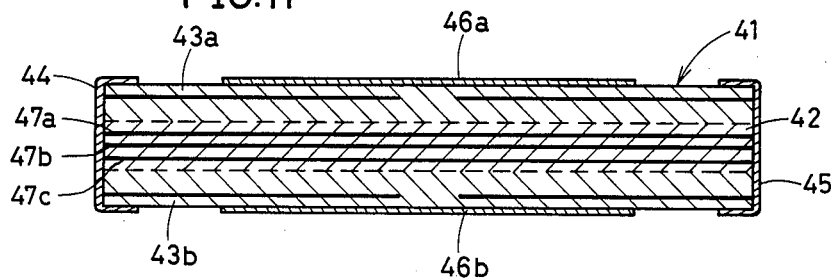
FIG. 11 is a sectional view showing a fourth embodiment of the present invention.
Figure 12:
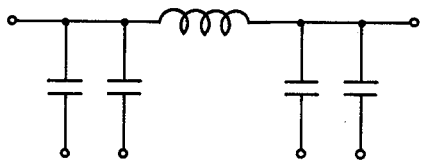
FIG. 12 illustrates an equivalent circuit of the embodiment as shown in FIG. 11.

FIG. 11 is a sectional view showing an LC composite component according to a fourth embodiment of the present invention. This embodiment is obtained by modifying the LC composite component of the embodiment as shown in FIG. 9. In this embodiment, a sintered body 41 is provided with a magnetic region 42 and dielectric regions 43a and 43b. The dielectric regions 43a and 43b are identical in structure to the dielectric region 33 as shown in FIG. 9. Thus, similar components are indicated by corresponding reference numerals and description thereof is omitted. FIG. 12 shows an equivalent circuit of the LC composite component as shown in FIG. 11.

Figure 13:
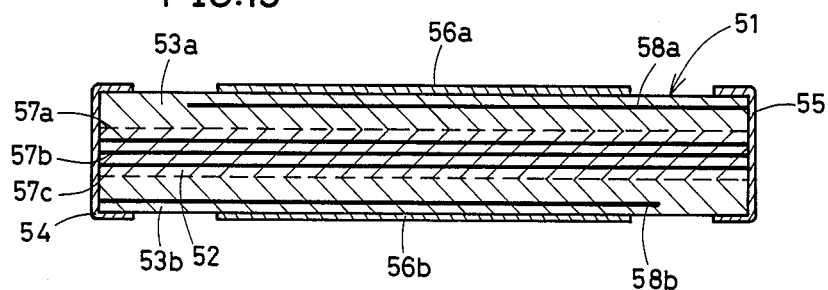
FIG. 13 is a sectional view showing an LC composite component according to a fifth embodiment of the present invention.

FIG. 13 is a sectional view showing an LC composite component according to a fifth embodiment of the present invention. The LC composite component of this embodiment is also a modification of the LC composite component of the embodiment as shown in FIG. 1. A ceramic sintered body 51 is provided therein with a magnetic region 52 and dielectric regions 53a and 53b. A capacitor unit defined by the dielectric region 53b is similar to that of the capacitor unit defined by the dielectric region 13 as shown in FIG. 1, and corresponding parts are indicated by the same reference numerals. In another capacitor unit defined by the dielectric region 53a, on the other hand, an electrode 58a is electrically connected with another first outer electrode 55. Therefore, an equivalent circuit of the LC composite component as shown in FIG. 13 is the π-type noise filter circuit as shown in FIG. 10.

Figure 14:
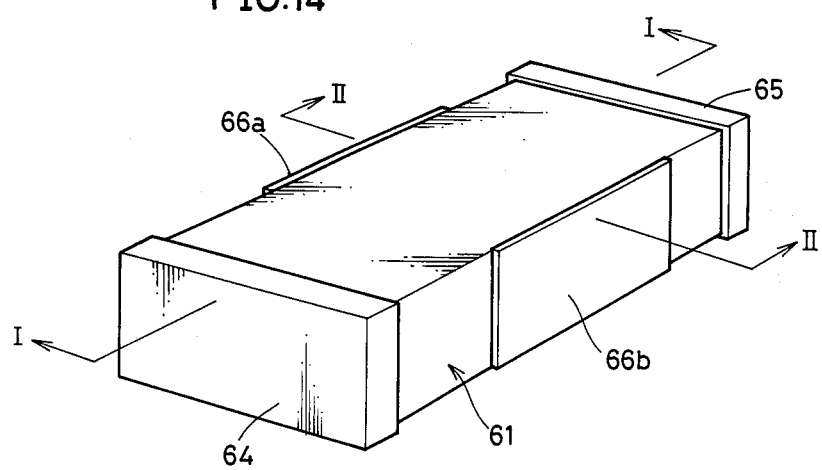
FIG. 14 is a perspective view showing a sixth embodiment of the present invention.
Figure 15:
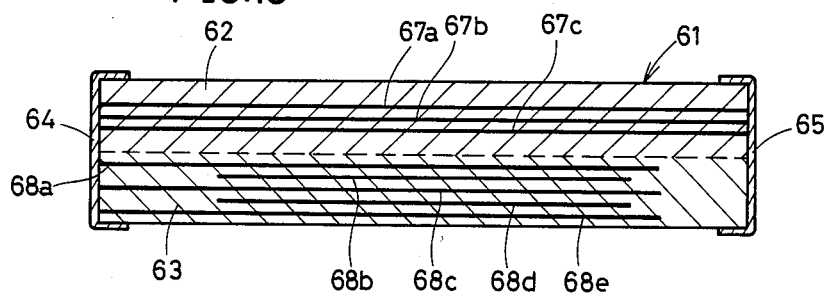
FIG. 15 is a sectional view taken along the line I—I in FIG. 14.
Figure 16:
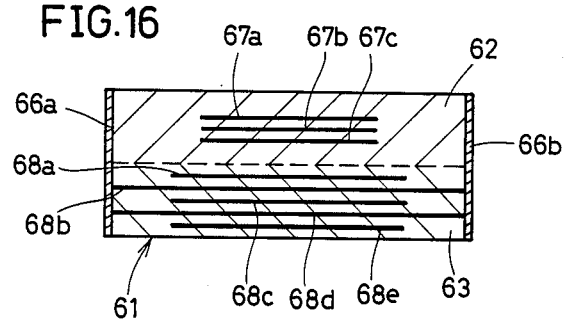
FIG. 16 is a sectional view taken along the line II—II in FIG. 14.

FIG. 14 is a perspective view showing a sixth embodiment of the present invention, and FIGS. 15 and 16 are sectional views taken along the lines I—I and II—II in FIG. 14 respectively. A ceramic sintered body 61 is provided therein with a magnetic region 62 and a dielectric region 63 along the direction of thickness. The magnetic region 62 is similar in structure to that of the embodiment as shown in FIG. 1, and description thereof is omitted with corresponding reference numerals being assigned to similar parts. In the dielectric region 63, electrodes 68a to 68e are opposite to each other and spaced apart within the dielectric region. Within the electrodes 68a to 68e, the electrodes 68a, and 68c and 68e form the "first electrode" of the present invention and are electrically connected with a first outer electrode 64. The electrodes 68b and 68d form the "second electrode" of the present invention, which extend to the remaining two side surfaces of the sintered body 61 and are there electrically connected with second outer electrodes 66a and 66b. Therefore, capacitance is extracted between the first outer electrodes 64 and 65 on the one hand and the second outer electrodes 66a and 66b on the other hand. Thus, the embodiment as shown in FIG. 14 also forms an L-shaped filter.

Figure 17:
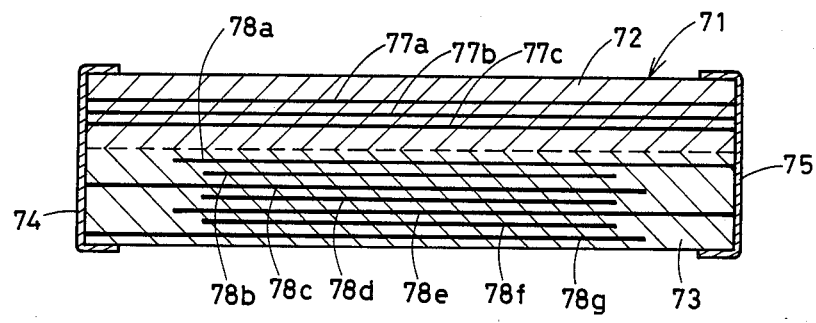
FIG. 17 is a sectional view for illustrating a seventh embodiment of the present invention.
Figure 18:
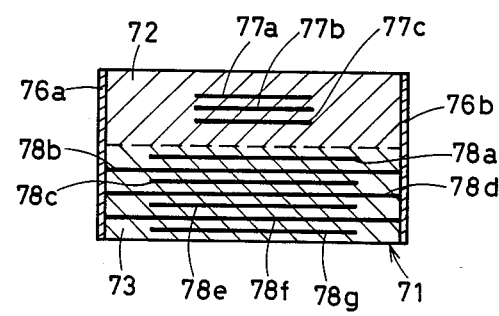
FIG. 18 is a cross-sectional view of the embodiment as shown in FIG. 17.

FIG. 17 is a sectional view showing an LC composite component according to a seventh embodiment of the present invention. A ceramic sintered body 71 is provided therein with a magnetic region 72 and a dielectric region 73. The magnetic region 72 defining an inductance unit is similar in structure to that of the embodiment as shown in FIG. 14. The dielectric region 73 is provided with a plurality of electrodes 78a to 78g. Within the plurality of electrodes 78a to 78g, the electrodes 78a, 78c, 78e and 78g form the "first electrode" of the present invention, to be alternately electrically connected with a first outer electrode 75 or 74 in the direction of thickness. In other words, the electrodes 78a and 78e are electrically connected with the first outer electrode 75 while the electrodes 78c and 78g are electrically connected with the other first outer electrode 74. The electrodes 78b, 78d and 78f form the "second electrode" of the present invention, to be electrically connected with second outer electrodes 76a and 76b formed on the remaining both side surfaces of the sintered body 71. Thus, the LC composite component of the embodiment as shown in FIG. 17 forms the so-called π-type filter.

In each of the aforementioned embodiments, a single LC composite component is provided in a single ceramic sintered body. In addition, a plurality of LC composite components can be provided in a single sintered body and coupled with each other as described hereinafter.

Figure 19:
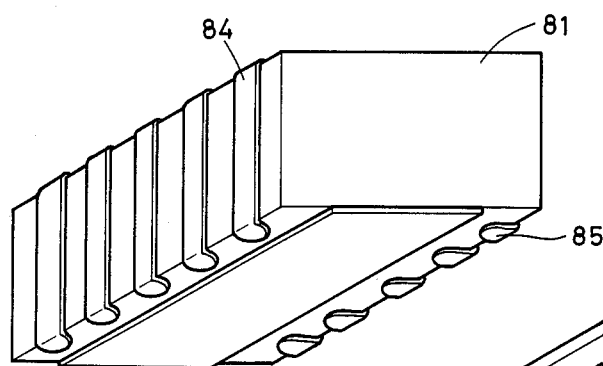
FIG. 19 is a perspective view showing an eighth embodiment of the present invention, in which a plurality of LC composite components are provided in a single sintered body.

FIG. 19 is a perspective view showing an eighth embodiment of the present invention, in which a plurality of LC composite components are provided in a ceramic sintered body 81. A filter block of this embodiment is obtained by providing a plurality of LC composite components of the embodiment as shown in FIG. 9 in the single ceramic sintered body 81.

Figure 20:
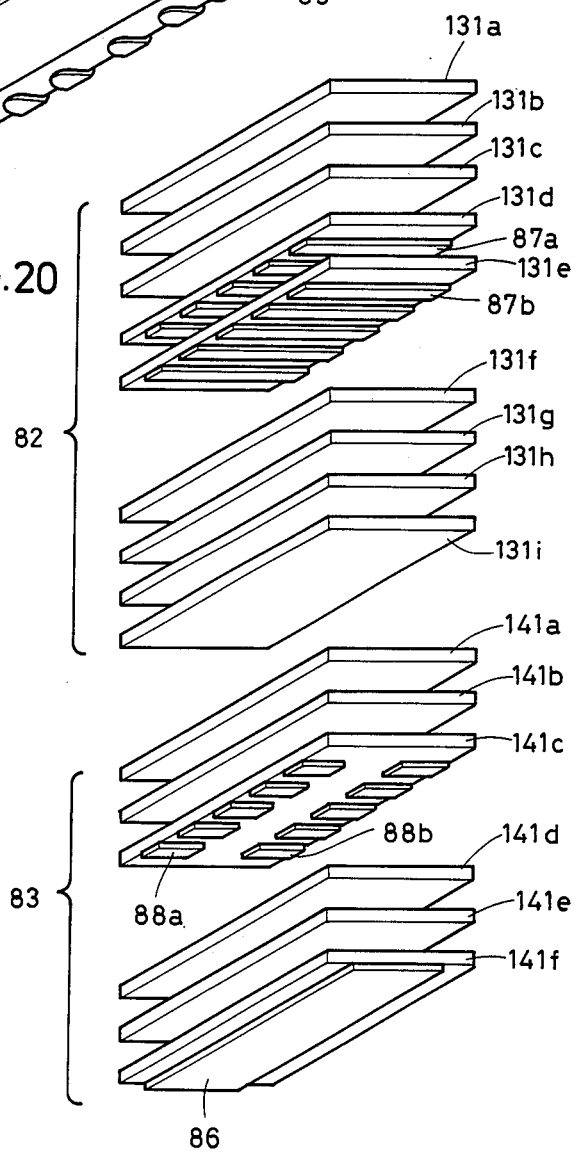
FIG. 20 is an exploded perspective view of a filter block according to the embodiment as shown in FIG. 19.

Referring to FIG. 20 being a virtual exploded perspective view, a magnetic region 82 is formed by laminating magnetic green sheets 131a to 131i. Within the magnetic green sheets 131a to 131i, the magnetic green sheets 131d and 131e are provided on lower surfaces thereof with pluralities of conductive paste layers 87a and 87b to reach both edges in the cross direction. The conductive paste layers 87a and 87b correspond to the inner electrodes 37a to 37c in the embodiment of FIG. 9.

On the other hand, a dielectric region 83 is formed by dielectric green sheets 141a to 141f. The dielectric green sheet 141c is provided on its lower surface with pluralities of electrodes 88a and 88b respectively extending inwardly from both cross directional edges of the dielectric green sheet 141c. The conductive paste layers 88a and 88b correspond to the electrodes 38a and 38b in the embodiment as shown in FIG. 9 respectively. Further, a common electrode 16 is formed on the lower surface of the lowermost dielectric green sheet 141f. The common electrode 86 corresponds to the second outer electrode 36 in the embodiment of FIG. 9. Since a plurality of LC composite components are integrally formed in the embodiment as shown in FIG. 19, the common electrode 86 also serves as a second electrode for each LC composite component.

Magnetic green sheets 131a to 131i and dielectric green sheets 141a to 141f as shown in FIG. 20 are laminated in the illustrated state and brought into contact with each other under pressure to be cofired, thereby to obtain the ceramic sintered body 81 as shown in FIG. 19. First outer electrodes 84 and 85 are formed on the outer side surfaces of the ceramic sintered body 81. As shown in FIG. 20, the outer electrodes 84 and 85 are provided in plural to correspond to the respective LC composite components formed in the ceramic sintered body 81.

Figure 21:
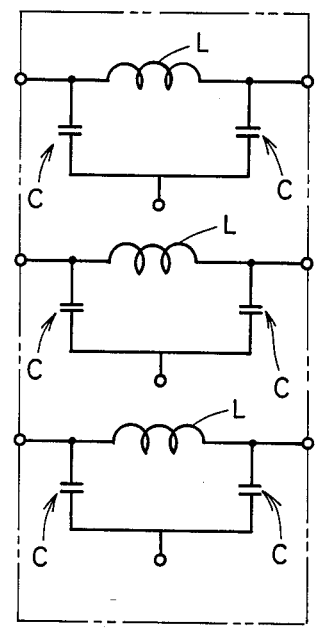
FIG. 21 illustrates an equivalent circuit of the embodiment as shown in FIG. 19.

The embodiment as shown in FIG. 19 is formed by a plurality of LC composite components coupled in a single ceramic sintered body 81, whereby a number of LC filters can be readily mounted on a printed circuit board (not shown). FIG. 21 shows an equivalent circuit of the embodiment as shown in FIG. 19.

Figure 22:
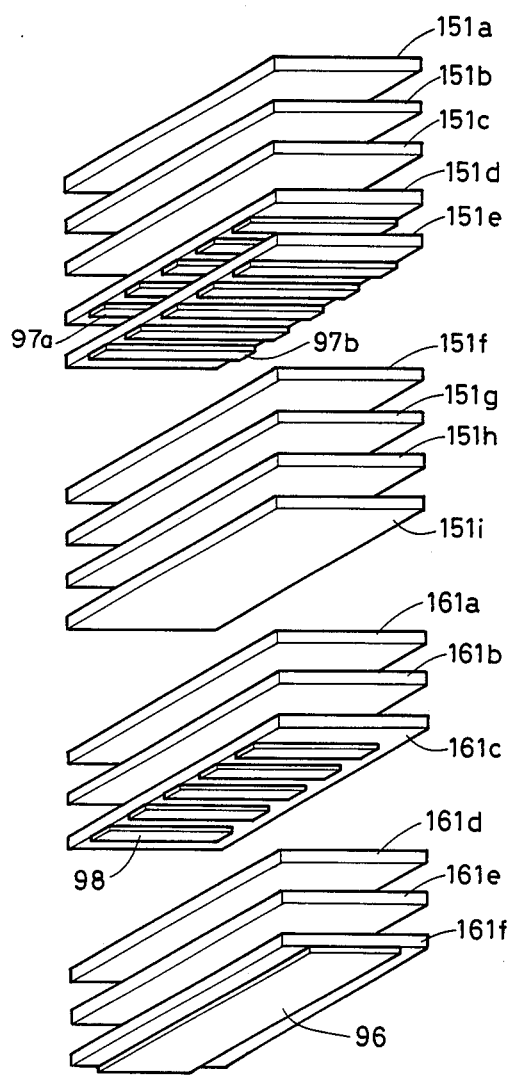
FIG. 22 is an exploded perspective view showing a filter block according to a ninth embodiment of the present invention.

FIG. 22 is a perspective view for illustrating a ninth embodiment of the present invention, of which FIG. 20 is also an exterior perspective view. Also in this embodiment, a plurality of LC composite components are provided in a single sintered body. In this embodiment, a plurality of magnetic green sheets 151a to 151i define a magnetic region. Such structure is similar to that of the embodiment as shown in FIG. 19, and hence description thereof is omitted with the same reference numerals being assigned to corresponding parts.

Figure 23:
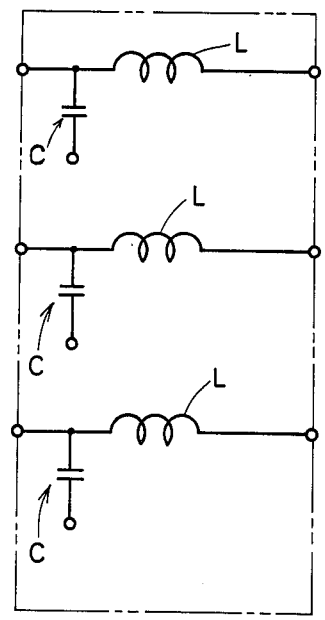
FIG. 23 illustrates an equivalent circuit of the embodiment as shown in FIG. 22.

On the other hand, a dielectric region is defined by dielectric green sheets 161a to 161f corresponding to a plurality of dielectric regions 13 as shown in FIG. 2. Namely, the dielectric green sheet 161c is provided on its lower surface with a plurality of conductive paste layers 98 corresponding to the electrode 18 as shown in FIG. 2 to extend from one edge of the dielectric green sheet 161c not to reach the other edge. Capacitance based on the dielectric green sheets 161d, 161e and 161f is extracted by the conductive paste layers 98 and a common electrode 96 formed on the lower surface of the dielectric green sheet 161f. In the embodiment as shown in FIG. 22, the magnetic green sheets 151a to 151i and the dielectric green sheets 161a to 161f are laminated in the shown order to be cofired, while first outer electrodes are formed on side surfaces of the sintered body thus obtained similarly to the embodiment as shown in FIG. 19, thereby to obtain an LC filter block whose equivalent circuit is shown in FIG. 23.

In each of the aforementioned embodiments, the magnetic region and the dielectric region are adjacently located in the ceramic sintered body. In this case, when the magnetic material is prepared from ferrite powder or the like and the dielectric material is prepared from barium titanate powder or the like, the sintering temperature is increased to about 1200° to 1400° C. Therefore, cofiring is found to cause an extreme reaction between the materials, whereby counter diffusion takes place in the interface between the same. As the result of such counter diffusion, the desired Q-value cannot be obtained in the inductance unit, and the dielectric dissipation factor is increased in the capacitor unit, whereby desired characteristics cannot be obtained.

The inventor has found that the aforementioned characteristic deterioration caused by counter diffusion can be prevented by employing composite perovskite material containing lead as the dielectric material and Ni-Zn system ferrite as the magnetic material to enable sintering at a low temperature, as disclosed in U.S. patent application Ser. No. 879,908 (pending). Thus, the magnetic material for the magnetic region in the LC composite component according to the present invention is preferably prepared from Ni-Zn ferrite as shown in Table 1, a pre-sintered compact of which can be sintered at a relatively low temperature, lower than about 1150° C., while the dielectric material for the dielectric region is preferably prepared from composite perovskite material containing lead as shown in Table 2, a pre-sintered compact of which can be sintered at a low temperature, lower than about 1000° C. When each of the embodiments as shown in FIGS. 1 to 23 is formed from the magnetic material and the dielectric material as shown in Tables 1 and 2, the sintering temperature is 1150° C. at the highest and generally is approximately 800° C.~1100° C., whereby reaction between the dielectric region and the magnetic region upon firing is mild to enable effective cofiring, substantially with no counter diffusion.

TABLE 1

| Composition (Molecular Ratio) | Sintering Temperature (°C.) |
| --- | --- |
| 0.17 NiO—0.3 ZnO—0.05 CuO—0.48 $Fe_2O_3$ | 1000-1100 |
| 0.174 NiO—0.305 ZnO—0.065 CuO—0.001 CoO—0.065 MgO-0.49 $Fe_2O_3$ | 1000-1100 |
| 0.12 NiO—0.3 ZnO—0.08 CuO—0.5 $Fe_2O_3$ | 1000-1100 |
| 0.3 NiO—0.1 CuO—0.3 ZnO—0.3 $Fe_2O_3$ | 1000-1150 |
| 0.3 NiO—0.1 CuO—0.3 ZnO—0.4 $Fe_2O_3$ | 1000-1150 |
| 0.4 NiO—0.1 CuO—0.26 ZnO—0.4 $Fe_2O_3$ | 1000-1150 |
| 0.17 NiO—0.08 CuO—0.3 ZnO—0.45 $Fe_2O_3$ | 1000-1150 |

TABLE 2

| COMPOSITION (Molecular Ratio) | Sintering Temperature (°C.) | Permittivity | Dielectric Dissipation Factor | Specific Resistance (Ω cm) |
|---|---|---|---|---|
| $(1 - x)Pb(Fe_{\frac{1}{2}}Nb_{\frac{1}{2}})O_3 - xA(Cu_{\frac{1}{2}}Nb_{\frac{2}{3}})O_3$ (where A: at least one of Pb, Ba, Sr and Ca, x = 0.001-0.12) | 900 (where x = 0.08, $MnO_2$: zero) | 16400 " | 0.99 " | $1.96 \times 10^{11}$ " |
| $xPb(Fe_{\frac{1}{2}}Nb_{\frac{1}{2}})O_3 - (1 - x)Pb(Fe_{\frac{1}{2}}Ta_{\frac{1}{2}})O_3$ (where x = 0.3-0.7) | 970 (where x = 0.50, no additive) | 12750 " | 0.6 " | $6.12 \times 10^{11}$ " |
| $xPb(Fe_{\frac{1}{2}}Nb_{\frac{1}{2}})O_3 - yPb(Fe_{\frac{2}{3}}W_{\frac{1}{3}})O_3 - zPb(Zn_{\frac{1}{2}}W_{\frac{1}{2}})O_3$ (where x, y, z = values in the following polygons: (0.8, 0.19, 0.01) (0.8, 0.1, 0.1) (0.6, 0.1, 0.3) (0.4, 0.3, 0.3) (0.4, 0.5, 0.1) (0.5, 0.49, 0.01)) | 970 (where x = 0.8, y = 0.1, z = 0.1) | 11000 " | 0.98 " | $7.2 \times 10^{10}$ " |
| $(1 - x)Pb(Fe_{\frac{1}{2}}Nb_{\frac{1}{2}})O_3 - xA(Cu_{\frac{1}{2}}Ta_{\frac{2}{3}})O_3$ (where A: at least one of Ba, Sr and Ca, x = 0.01-0.12) | 900 (where A: Ba, x = 0.05) | 15700 " | 1.6 " | $2.51 \times 10^{11}$ " |
| $0.2 Pb(Fe_{\frac{2}{3}}W_{\frac{1}{3}})O_3 - 0.8 Pb(Fe_{\frac{1}{2}}Nb_{\frac{1}{2}})O_3 - 0.5$ atmic % Bi | 880-980 | 11300 " | 1.5 " | $2 \times 10^{10}$ " |
| $xPb(Ni_{\frac{1}{2}}W_{\frac{1}{2}})O_3 - (1 - x)PbTiO_3$ (where x = 0.3-0.6) | 980 (where x = 0.55) | 6900 " | 0.3 " | $2 \times 10^{13}$ " |
| $xPb(Fe_{\frac{2}{3}}W_{\frac{1}{3}})O_3 - (1 - x)Pb(Fe_{\frac{1}{2}}Nb_{\frac{1}{2}})O_3 - A$ (where x = 0.2-0.5, A: 0.02-2.0 atmic % of at least one of W and Mo) | 900 (where x = 0.5, A: W of 0.2 atmic %) | 9800 " | 0.75 " | $1.8 \times 10^{10}$ " |
| $xPb(Mg_{\frac{1}{4}}Fe_{\frac{1}{4}}W_{\frac{1}{2}})O_3 - (1 - x)Pb(Mg_{\frac{1}{3}}Ta_{\frac{2}{3}})O_3$ (where x = 0.6-0.9) | 940 (where x = 0.8) | 3400 " | 1.5 " | $1.2 \times 10^{11}$ " |
| $(1 - x)Pb(Fe_{\frac{2}{3}}W_{\frac{1}{3}})O_3 - xPbTiO_3$ (where $0 < x \leq 0.65$) | 900 (where x = 0.2) | 11000 " | 7.5 " | $3.2 \times 10^{11}$ " |

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. An LC composite component comprising:
a laminated and cofired ceramic sintered body having a top surface and a bottom surface which define therebetween a thickness direction, comprising at least one magnetic green sheet laminated and cofired with at least one dielectric green sheet, said ceramic sintered body being thereby provided with at least one magnetic region and at least one dielectric region along the direction of thickness;
wherein said magnetic region comprises Ni-Zn system ferrite and said dielectric region comprises composite perovskite material containing lead;
at least one inductive inner electrode being provided in said magnetic region of said sintered body and extending between a pair of first side surfaces opposite each other on said sintered body to define an inductance unit in said magnetic region;
first and second capacitive electrodes being located opposite to each other in said dielectric region to enclose a portion of said dielectric region along the direction of thickness to define a capacitor unit in said dielectric region;
a pair of first outer electrodes electrically connected with said inductive inner electrode and formed on said pair of first side surfaces of said sintered body; and
a second outer electrode provided on a surface of said sintered body other than said first side surfaces,
said first capacitive electrode being electrically connected with at least one of said pair of first outer electrodes, and
said second capacitive electrode being electrically connected with said second outer electrode.

2. An LC composite component in accordance with claim 1, wherein said dielectric region is formed to be exposed on at least one of said top and bottom surfaces of said sintered body and said second outer electrode is formed on at least the same one of said top and bottom surfaces of said sintered body so that said second outer electrode also serves as said second capacitive electrode.

3. An LC composite component in accordance with claim 2, wherein dielectric regions are formed on both sides, along the direction of thickness, of said magnetic region,
a respective first capacitive electrode and a respective second outer electrode being formed on each respective one of said dielectric regions for defining said capacitor unit.

4. An LC composite component in accordance with claim 2, wherein said first capacitive electrode includes first and second inner electrodes connected with respective ones of said pair of first outer electrodes, said first and second inner electrodes both being opposite to said second outer electrode and thereby enclosing a portion of said dielectric region.

5. An LC composite component in accordance with claim 3, wherein each said first capacitive electrode includes first and second inner electrodes electrically connected with respective ones of said pair of first outer electrodes, said first and second inner electrodes both being opposite to said respective second outer electrode and thereby enclosing a portion of said dielectric region.

6. An LC composite component in accordance with claim 1, wherein said second outer electrode is formed on at least one side surface of said sintered body other than said first side surfaces of said sintered body, and
said second capacitive electrode is electrically connected with said second outer electrode and said first capacitive electrode is electrically connected with at least one of said first outer electrodes.

7. An LC composite component in accordance with claim 6, wherein said first capacitive electrode is electrically connected with only one of said first outer electrodes.

8. An LC composite component in accordance with claim 6, wherein said first capacitive electrode comprises a plurality of electrode layers in said dielectric region which are electrically connected with different first outer electrodes alternately in the direction of thickness.

9. A filter block comprising a plurality of LC composite components provided side by side in a single sintered body, each said component comprising:
   a laminated and cofired ceramic sintered body having a top surface and a bottom surface which define therebetween a thickness direction, comprising at least one magnetic green sheet laminated and cofired with at least one dielectric green sheet, said ceramic sintered body being thereby provided with at least one magnetic region and at least one dielectric region along the direction of thickness;
   wherein said magnetic region comprises Ni-Zn system ferrite and said dielectric region comprises composite perovskite material containing lead;
   at least one inductive inner electrode being provided in said magnetic region of said sintered body and extending between a pair of first side surfaces opposite each other on said sintered body to define an inductance unit in said magnetic region;
   first and second capacitive electrodes being located opposite to each other in said dielectric region to enclose a portion of said dielectric region along the direction of thickness to define a capacitor unit in said dielectric region;
   a pair of first outer electrodes electrically connected with said inductive inner electrode and formed on said pair of first side surfaces of said sintered body; and
   a second outer electrode provided on a surface of said sintered body other than said first side surfaces,
   said first capacitive electrode being electrically connected with at least one of said pair of first outer electrodes, and
   said second capacitive electrode being electrically connected with said second outer electrode;
   wherein said dielectric region is formed to be exposed on at least one of said top and bottom surfaces of said sintered body, and said second outer electrode is formed on at least the same one of said top and bottom surfaces of said sintered body, so that said second outer electrode also serves as said second capacitive electrode;
   said second outer electrodes of said plurality of components being formed on the same one of the top and bottom surfaces of said sintered body in all the respective said LC composite components.

10. A filter block in accordance with claim 9, wherein said first capacitive electrode is electrically connected with one of said first outer electrodes while being opposite to said second outer electrode and thereby enclosing a corresponding portion of said dielectric region in each of said LC composite components.

11. A filter block in accordance with claim 9, wherein said first capacitive electrode includes first and second inner electrodes connected with respective ones of said pair of first outer electrodes to be opposite to said second outer electrode and thereby enclose a portion of said dielectric part in each of said LC composite components.

12. A method of manufacturing an LC composite component comprising the steps of:
   preparing pluralities of magnetic green sheets and dielectric green sheets;
   wherein said magnetic green sheets comprise Ni-Zn system ferrite and said dielectric green sheets comprise composite perovskite material containing lead;
   coating conductive paste on at least one surface of at least one of said magnetic green sheets and at least one surface of at least one of said dielectric green sheets;
   laminating said magnetic green sheets and dielectric green sheets and cofiring the same to obtain a ceramic sintered body provided with a magnetic region and a dielectric region along the direction of thickness;
   providing first outer electrodes on a pair of first opposite side surfaces of said sintered body to be connected with inner electrodes formed by said at least one conductive paste layer formed in said magnetic region; and
   providing a second outer electrode on a surface of said sintered body other than said pair of first side surfaces.

13. An LC composite component in accordance with claim 1, wherein said at least one inductive inner electrode extends directly between said pair of first side surfaces to define said inductance unit.

14. A method of manufacturing an LC composite component in accordance with claim 13, wherein said at least one conductive paste layer formed in said magnetic region extends directly between said first outer electrodes on said pair of first opposite side surfaces of said sintered body.

* * * * *